(12) United States Patent
Kim et al.

(10) Patent No.: US 7,477,539 B2
(45) Date of Patent: Jan. 13, 2009

(54) MAGNETIC DEVICE USING MAGNETIC DOMAIN DRAGGING AND METHOD OF OPERATING THE SAME

(75) Inventors: Kae-won Kim, Yongin-si (KR);
Tae-wan Kim, Yongin-si (KR);
Young-jin Cho, Yongin-si (KR); In-Jun Hwang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 28 days.

(21) Appl. No.: 11/657,646

(22) Filed: Jan. 25, 2007

(65) Prior Publication Data

US 2007/0183188 A1      Aug. 9, 2007

(30) Foreign Application Priority Data

Jan. 26, 2006     (KR)     ................. 10-2006-0008242

(51) Int. Cl.
*G11C 11/00*     (2006.01)
(52) U.S. Cl. .................. 365/158; 365/157; 365/189.04; 365/173; 365/189.03
(58) Field of Classification Search .............. 365/158, 365/157, 189.04, 173, 189.03
See application file for complete search history.

(56) References Cited

U.S. PATENT DOCUMENTS

2003/0117837 A1 * 6/2003 Park et al. ................ 365/158

| | | |
|---|---|---|
| 2004/0251232 A1 | 12/2004 | Chen et al. |
| 2005/0078511 A1 | 4/2005 | Parkin |

FOREIGN PATENT DOCUMENTS

| | | |
|---|---|---|
| EP | 1-320-102 | 6/2003 |
| KR | 10-2003-0048842 | 6/2003 |

OTHER PUBLICATIONS

IEEE Transactions of Magnetics, vol. 36, No. 5, dated Sep. 2000.
Korean Office Action dated Dec. 13, 2006.
European Search Report dated Mar. 22, 2007.

* cited by examiner

*Primary Examiner*—Thong Q Le
(74) *Attorney, Agent, or Firm*—Harness, Dickey & Pierce, P.L.C.

(57) ABSTRACT

Example embodiments may provide a magnetic device using magnetic domain dragging and a method of operating the same. An example embodiment magnetic device may include a data storage cell with a free layer having a switchable magnetization direction and a plurality of adjoining magnetic domains, a reference layer formed to correspond to a portion of the free layer and having a pinned magnetization direction, wherein a plurality of data bit regions may be formed in an array in the free layer, each of the data bit regions being formed with an effective size unit of the reference layer, so that the data storage cell may store a plurality of bits of data in an array, and a first input portion electrically connected to at least one of the data bit regions of the free layer and the reference layer to apply at least one of a writing signal and a reading signal; and a second input portion electrically connected to the free layer to drag data stored in data bit regions of the free layer toward an adjacent data bit region, and applying a dragging signal for magnetic domain dragging.

22 Claims, 4 Drawing Sheets

MAGNETIC DEVICE USING MAGNETIC DOMAIN DRAGGING AND METHOD OF OPERATING THE SAME

PRIORITY STATEMENT

This application claims the benefit of Korean Patent Application No. 10-2006-0008242, filed on Jan. 26, 2006, in the Korean Intellectual Property Office, the disclosure of which is incorporated herein in its entirety by reference.

BACKGROUND

1. Field

Example embodiments may provide a magnetic device, for example, a magnetic device that may write and/or read a plurality of bits of data using a magnetic domain dragging technique, and a method of operating the same.

2. Description of the Related Art

Magnetic devices for information storage may be classified into roughly two categories: memory devices and storage devices. Memory devices benefit from improved solid-state performance, while storage devices benefit from improved storage capacity.

A magnetic random access memory (MRAM) is a type of non-volatile memory device and a new solid-state magnetic memory that uses magnetic resistance generated from a spin-dependent conduction phenomena of nano-magnetic material. An MRAM may use giant magnetoresistance (GMR) or tunnel magnetoresistance (TMR) generated by an externally-applied magnetic field's effect on electron position and net spin. Spin may be considered as a degree of freedom of electrons.

GMR is a resistance difference generated when ferromagnetic layers having a non-magnetic material placed between them have the same magnetization directions and have reverse magnetization directions in an adjoining arrangement of ferromagnetic material/metallic non-magnetic material/ferromagnetic material. TMR is resistance where a current easily flows if two ferromagnetic materials have the same magnetization direction in an adjoining arrangement of ferromagnetic material/insulator/ferromagnetic material compared to when the two ferromagnetic materials have reverse magnetization directions. Because an MRAM using GMR may have a relatively small resistance difference caused by a magnetization direction, a large voltage difference may not be possible to achieve. Also, because MRAMs have a relatively large size of metal oxide semiconductor field effect transistor (MOSFET) combining with a GMR layer to constitute a cell, there is a strong need for MRAMs with a TMR layer.

The MRAM may include a transistor, which is a switching device, and/or a magnetic tunnel junction (MTJ) cell in which data is stored. The MTJ cell may include a pinned ferromagnetic layer having a pinned magnetization direction, a free ferromagnetic layer whose magnetization direction may be parallel to or anti-parallel to the pinned magnetization direction of the pinned ferromagnetic layer, and/or a non-magnetic layer between the pinned ferromagnetic layer and the free ferromagnetic layer that magnetically separates the pinned ferromagnetic layer and the free ferromagnetic layer.

Because a related art MRAM may store only one bit of data per MTJ cell, the data storage capacity of the MRAM may not be increased to desired levels. A new storage technology may be required to increase the information storage capacity of a related art magnetic memory such as the MRAM.

SUMMARY

Example embodiments may provide a magnetic device using a magnetic domain dragging technique to store a plurality of bits of data or read the stored data when a magnetic domain wall is formed in a free layer to form a plurality of magnetic domains and a method of operating such a device.

Example embodiments may provide a magnetic device that includes a data storage cell, a first input portion, and/or a second input portion. The data storage cell may include a free layer with a switchable magnetization direction and a plurality of adjoining magnetic domains and may include a reference layer that corresponds to a portion of the free layer and that has a pinned magnetization direction. A plurality of data bit regions may be formed in an array in the free layer in an effective size unit of the reference layer to allow the data storage cell to store a plurality of bits of data in the array. The first input portion may be electrically connected to the data bit regions of the free layer and/or to the reference layer to apply a writing signal and/or a reading signal. The second input portion may be electrically connected to the free layer to drag data stored in the data bit regions of the free layer toward an adjacent data bit region by applying a dragging signal for magnetic domain dragging.

The writing signal may be a switching current in a pulse form.

The reading signal may be a pulse current smaller than the switching current.

The dragging signal and either the switching current or the pulse current for reading may be input alternately so that a magnetic domain dragging operation and either a data storing operation or a data reading operation and may be performed alternately.

The data bit region may include at least one magnetic domain, and magnetic domain dragging may be performed by a data bit region unit.

The magnetic device may further include a non-magnetic layer between the reference layer and the free layer.

The non-magnetic layer may be a conduction layer or an insulation layer serving as a tunneling barrier.

The magnetic device may include a buffer cell that adjoins the data storage cell and is formed on one or more sides of the data storage cell to store data dragged outside of the data storage cell region by magnetic domain dragging.

A plurality of data storage cells may be formed. The buffer cell may be located between two adjacent data storage cells. At least one first input portion may be formed for each data storage cell.

The plurality of data storage cells may be formed in an array, and any first input portion(s) may be placed to correspond to each of the data storage cells.

Example embodiments may provide a method of operating a magnetic device, including storing data by a magnetization direction designation of one or more data bit region(s) of a plurality of adjoining data bit regions or reading the stored data according to a magnetization direction of the data bit region and performing magnetic domain dragging. The magnetic domain dragging and either the data storing or the stored data reading are performed alternately.

BRIEF DESCRIPTION OF THE DRAWINGS

The above and other features and/or advantages of example embodiments will become more apparent by describing them in detail with reference to the attached drawings in which.

DETAILED DESCRIPTION

Figure 1:
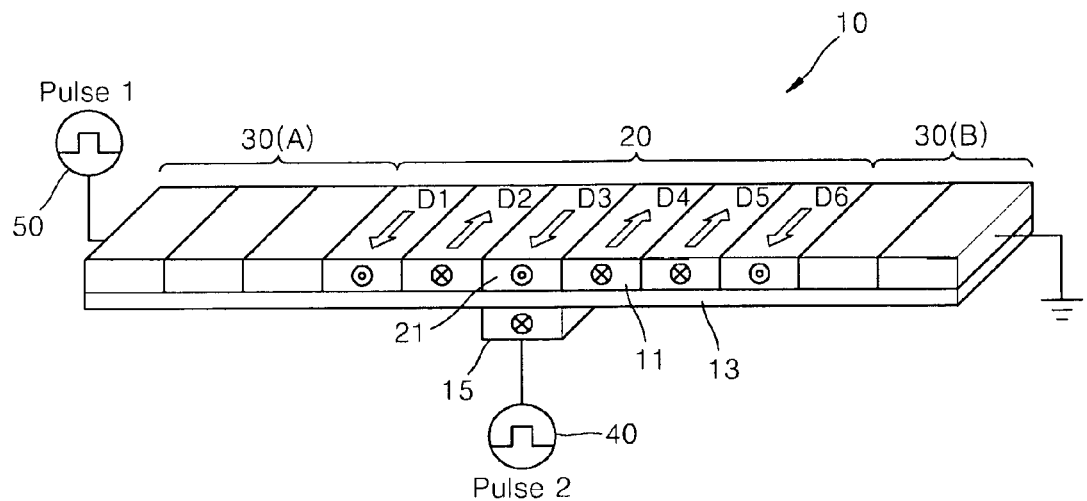
FIGS. 1 and 2 are views of an example embodiment magnetic device.

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout. Example embodiments should not be construed as limited to the particular shapes of regions illustrated in these figures but are to include deviations in shapes that result, for example, from manufacturing. For example, a region illustrated as a rectangle will, typically, have rounded or curved features at its edges. Thus, the regions illustrated in the figures are schematic in nature and their shapes are not intended to illustrate the actual shape of a region of a device and are not intended to limit the scope of the claims.

Figure 2:
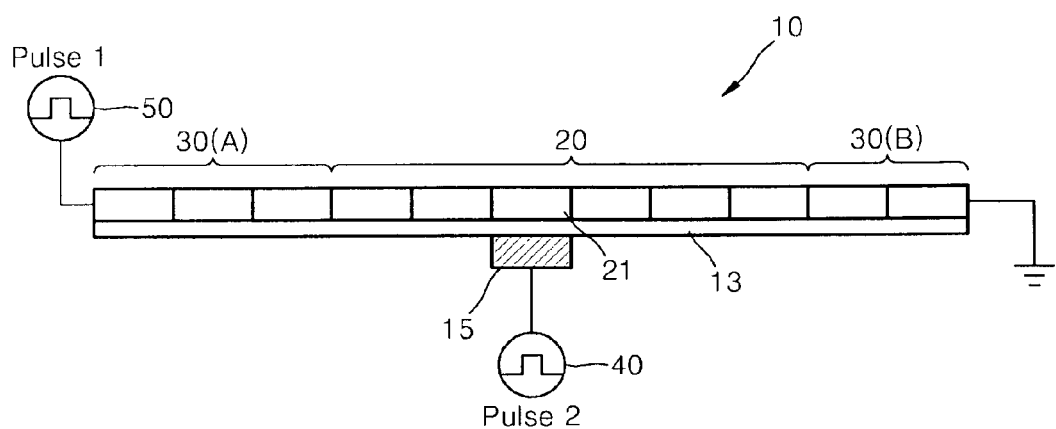

FIGS. 1 and 2 are views of an example embodiment magnetic device 10.

As shown in FIGS. 1 and 2, a magnetic device 10 may include a data storage cell 20, a first input portion 40, and/or a second input portion 50. The data storage cell 20 may store a plurality of data bits. The first input portion 40 may input a signal, Pulse 2, for a writing signal and/or a reading signal. The second input portion 50 may input a dragging signal, Pulse 1, for dragging a magnetic domain.

The data storage cell 20 of the magnetic device 10 may include a free layer 11 and/or a reference layer 15. The free layer 11 may have a switched magnetization direction and may have a plurality of adjoining magnetic domains. The reference layer 15 is formed to correspond to a portion of the free layer 11. A non-magnetic layer 13 may be arranged between the reference layer 15 and the free layer 11. The non-magnetic layer 13 may be formed on a lower surface of the free layer 11.

Figure 5:
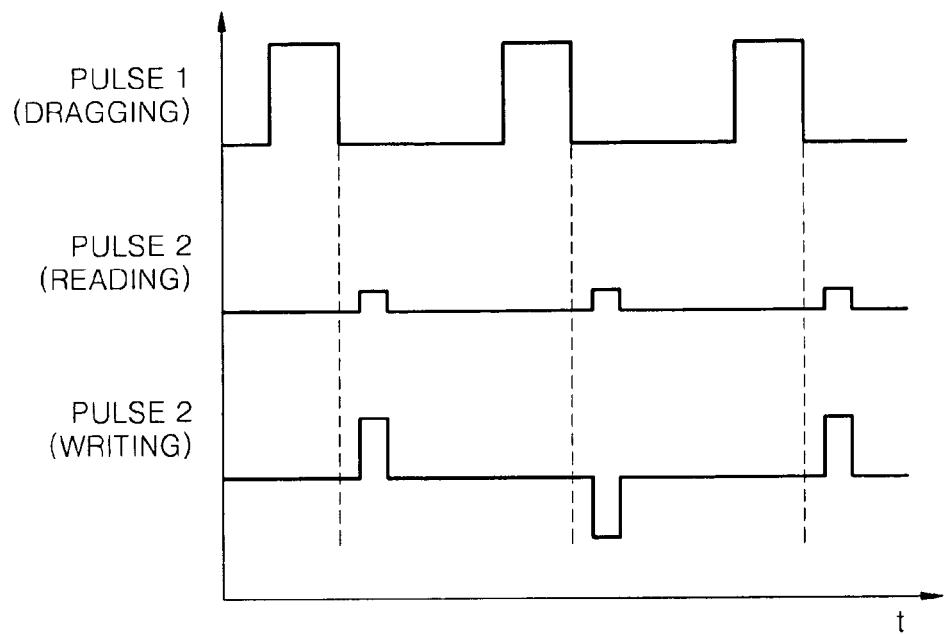
FIG. 5 is a graph of a dragging current signal Pulse 1 (Dragging), a reading pulse current signal Pulse 2 (reading), and a switching writing pulse current signal Pulse 2 (writing), which may be applied to an example embodiment magnetic device.

The magnetic device 10 may drag the adjoining magnetic domains in the free layer 11 corresponding to the dragging signal Pulse 1 applied through the second input portion 50 and may magnetically reverse a portion of the magnetic region, for example, a location corresponding to the reference layer 15, to store a data bit, for example 0 or 1, by a writing signal, for example Pulse 2 (writing) in FIG. 5, applied through the first input portion 40 by synchronizing with the dragging signal Pulse 1 using a current induced magnetic switching (CIMS) method, for example spin transfer torque.

The magnetic device 10 may drag magnetic domains and may apply a reading signal, for example a reading pulse signal, between the free layer 11 and the reference layer 15 that corresponds to the dragging signal Pulse 1 applied through the second input portion 50 and the reading signal, for example Pulse 2 (reading) in FIG. 5, applied through the first input portion 40 by synchronizing with the dragging signal pulse 1. The magnetic device 10 may read information data stored in the magnetic domain through a spin tunneling effect.

The Pulse 2 in FIGS. 1 and 2 may be a reading signal or a writing signal.

The free layer 11 may be configured to switch its magnetization direction and may include magnetic domain walls. The plurality of adjoining magnetic domains defined by the magnetic domain walls may be arranged in the free layer 11. The free layer 11 may be formed of a material with ferromagnetic properties. The width of the magnetic domains, which may be defined by the magnetic domain walls, may be adjusted based on the type of ferromagnetic material used and/or any depositing conditions of the material. The magnetization directions of the magnetic domains may be switched independently.

In the magnetic device 10, storing data or reading data may be performed by an area unit of the free layer 11, which may correspond to the effective size of the reference layer 15. The effective size of the reference layer 15 may be the size required to store a single data bit. The effective size of the reference layer 15 may determine the size of a data bit area in the free layer 11.

The length of the free layer 11 may be based on the product of the number of data bits to be stored and the effective size of the reference layer 15, for example, the length of the reference layer 15 in a magnetic domain dragging direction. The data storage cell 20 may include a plurality of data bit regions in an array to store a plurality of bits of data therein based on the effective size unit of the reference layer 15.

FIG. 1 is a view of first through sixth data bit regions, D1 to D6, each of which may have a size corresponding to the reference layer 15 to store six data bits. The number of data bit regions may be increased if necessary. In the magnetic device 10, each of the data bit regions D1 to D6 may be formed of a single magnetic domain with a magnetic domain barrier on both ends of each of the data bit regions D1 to D6, or each may be formed of two or more magnetic domains. The data bit regions D1 to D6 may include at least one magnetic domain.

The reference layer 15 may have a pinned magnetization direction and may be formed to correspond to a partial region, for example a one data bit region, in adjoining magnetic domains of the free layer 11. The reference layer 15 may be formed of a material with ferromagnetic properties. As shown in FIG. 1, the reference layer 15 may be formed below the third data bit region D3.

The non-magnetic layer 13 may be a conductive layer formed of a conductive material, for example copper (Cu) or the like, or the non-magnetic layer may be an insulation layer formed of am insulating material, for example aluminum oxide or the like, that may serve as a tunneling barrier.

The first input portion 40 may be electrically connected to at least one data bit region of the free layer 11 and the reference layer 15.

FIGS. 1 and 2 are views of the first input portion 40 when electrically connected to the reference layer 15 and a single data bit region 21 on the reference layer 15.

A writing signal may be applied to the free layer 11 and/or the reference layer 15 through the first input portion 40. The writing signal may determine the magnetization direction of the data bit region 21 on the reference layer 15. As shown in FIG. 1, the data storage cell 20 may include an array of the first through sixth data bit regions D1 to D6. The data bit region 21 connected electrically to the first input portion 40 is labeled at the third data bit region D3.

If the writing signal is applied through the first input portion 40, the writing signal may set the magnetization direction of the third bit region D3. For example, if the third data bit region D3 has an initial magnetization direction, that direction may be reversed or maintained depending on the applied writing signal. The magnetization direction may represent recorded bit of data.

The writing signal may be a pulse-type switching current as show FIG. 5. The magnetization direction of the data bit region 21, labeled as the third data bit region D3, in the free layer 11 on the reference layer 15 may be selectively switched depending on a polarity of the switching current so that a data bit, for example 0 or 1, may be stored in the data bit region 21.

For example, when a desired switching current is applied, it may cause the magnetization direction of the data bit region 21 to be identical to that of the magnetization direction of reference layer 15, and a data bit may be designated as zero "0". If a switching current of an opposite polarity is applied, it may cause the data bit region 21 to have a magnetization direction opposite (anti-parallel) to that of the reference layer 15, and the data bit may be designated as one "1". The data may be stored by changing the polarity of a switching current to make the magnetization direction of the data bit region identical or opposite to that of the reference layer 15. As shown in FIG. 1, arrows in the first through sixth data bit regions D1 to D6 represent magnetization directions.

A reading signal, for example Pulse 2 (reading) in FIG. 5, may be applied to the data bit region 21 of the free layer 11 and the reference layer 15 through the first input portion 40 during a data reading period. The reference layer 15, the data bit region 21 of the free layer 11 on the reference layer 15, and the non-magnetic layer 13 may form a magnetic tunnel junction (MTJ) cell. An amount of current passing through the MTJ cell and a resistance of the MTJ cell may be changed depending on whether the magnetization direction of the data bit region 21 is parallel or anti-parallel to the reference layer 15. From this orientation of magnetization directions, a data reading operation may be performed.

As shown in FIG. 5, the pulse current for reading may have a lesser magnitude than the switching current for writing. The pulse current for reading may be synchronized and applied with the dragging signal for domain dragging. The stored data information may be read according to the magnetization direction of the data bit region 21.

The second input portion 50 may be electrically connected to the free layer 11 in order to drag data stored in a data bit region of the free layer 11 to an adjacent data bit region by matching the magnetization directions of the adjacent data bit regions. If the dragging signal Pulse 1 is input and applied through the second input portion 50, the magnetization direction of the magnetic domain may be dragged to an adjacent magnetic domain. The data bit of an initial data bit region may be moved to an adjacent data bit region. This may be referred to as magnetic domain dragging.

The dragging signal Pulse 1 may be a pulse current, which may be applied during a given interval. The dragging signal Pulse 1 may be applied to perform magnetic domain dragging in a data bit region unit having at least one magnetic domain. Because the magnetic domain dragging may match a magnetization direction of an initial magnetic domain with that of an adjacent magnetic domain, the dragging signal Pulse 1 may be maintained during the magnetic domain dragging in each data bit region unit and may be periodically applied to perform the magnetic domain dragging by a data bit region unit.

Either the switching current signal for writing or the reading pulse current signal are applied alternately with a dragging signal. Accordingly either a data storing operation or a data reading operation are performed alternately to a magnetic domain dragging operation. A plurality of data bits may be sequentially stored in a plurality of data bit regions and/or sequentially read from the plurality of data bit regions.

The magnetic device 10 may include a buffer cell 30 adjoining the storage cell 20 on at least one side of the storage cell 20 to store data, which may be dragged outside the data storage cell 20 region during the magnetic domain dragging.

The number of data bit regions in the buffer cell 30 may be identical to or one less than the number of data bit regions of the data storage cell 20. For example, if the data storage cell 20 includes n data bit regions, the buffer cell 30 may include n or n−1 data bit regions. Physical characteristics of the free layer 11 in the data storage cell 20 and the buffer cell 30 may be identical. As shown in FIGS. 1 and 2, a middle portion of the free layer 11 may be used as the data storage cell 20, and both side portions of the free layer 11 may be used as the buffer cell 30. Because a writing signal or a reading signal may not be directly applied to the buffer cell 30, the buffer cell 30 may include only the free layer 11 or a layer structure with the free layer 11 and/or the non-magnetic layer 13 below the free layer 11. The buffer cell 30 may have a layer structure identical to that of the data storage cell 20. The layer structure may include the reference layer 15. A signal may not be applied to the reference layer 15 of the buffer cell 30.

As shown in FIGS. 1 and 2, data storing or data reading may be performed in the third data bit region D3 of the data storage cell 20. The buffer cell 30 may include a first portion A and/or a second portion B on both sides of the data storage cell 20. If magnetic domain dragging is performed from left to right during data reading, the first portion A of the buffer cell 30 may include three data bit regions on the left side of the data storage cell 20, and the second portion B of the buffer cell 30 may include two data bit regions on the right side of the data storage cell 20. The reading of the data in the six data bit regions D1 to D6 of the data storage cell 20 may be initiated by dragging the data in the six data bit regions D1 to D6 to the left to place a sixth data bit region D6 in a position of the third data bit region D3. Then reading the data and dragging the data region to the right may be performed alternately until all the data in the six data bit regions D1 to D6 are read.

As shown in FIGS. 1 and 2, the reference layer 15 may be formed on the middle of the data storage cell 20, and the data storing or reading operation may be performed on the middle of the data storage cell 20.

For example, storing data or reading data may be performed in the first data bit region D1 of the data storage cell 20. The buffer cell 30 may have a number of data bit regions equal to or one less than the number of the data bit regions in the data storage cell 20. The buffer cell 30 may be placed adjacent to the data bit region where a data reading operation or a data storing operation of the data storage cell 20 begins or on both sides of the data bit region. For example, if a data reading operation or a data storing operation begins at the first data bit region D1, the buffer cell 30 may be at the left side of the data storage cell 20, and if a data reading operation or a data storing operation begins at the sixth data bit region D6, the buffer cell 30 may be at the right side of the data storage cell 20.

If the buffer cell 30 is located at the right or the left of the data storage cell 20, the data of the data storage cell 20 may be dragged toward the buffer cell 30, and the data reading operation may be performed during a data reading period. Magnetic domain dragging performed during the data reading and storing may be performed in the same direction. If data of the data storage cell 20 are moved to the buffer cell 30, the data reading may be performed. The magnetic domain dragging may be performed in opposite directions during the data reading and storing.

If n bits of data are stored in the data storage cell 20, the number of data bit regions in the buffer cell 30 may be one less than the number of data bit regions in the data storage cell 20. This may be because the buffer cell 30 may be formed to store n−1 bits of data, because the one bit of data may be stored in the data bit region where data reading or data storing of the data storage cell 20 is performed and n−1 bits of data may be temporarily stored in the buffer cell 30.

If the buffer cell 30 is on both sides of the data storage cell 20, data of the data storage cell 20 may be read during performing magnetic domain dragging without moving the data to the buffer cell 30 before reading operation. The magnetic domain dragging performed during the data reading and the magnetic domain dragging performed during the data storing may be performed in opposite directions. If the n-bit data is stored in the data storage cell 20, the number of data bit regions in the buffer cell 30 on both sides of the data storage cell 20 may be one less than the number of the data bit regions in the data storage cell 20.

The magnetic device 10 may include only the data storage cell 20 without the buffer cell 30. For example, the data storage cell 20 may include an additional data bit region serving as a buffer by adding the number of bits to be stored in the data bit region to the data storage cell 20. For example, when n bit data is stored, a 2n or 2n−1 data bit region may be formed to the data storage cell 20.

In the magnetic device 10, either a switching current for writing or a pulse current for reading may be applied alternately to a dragging current. Either a data storing operation or a data reading operation may be performed alternately with a magnetic domain dragging operation.

The data storing and data reading operations of the magnetic device 10 will be described with reference to FIGS. 3A through 3C, 4A, and 4B.

Figure 3A:
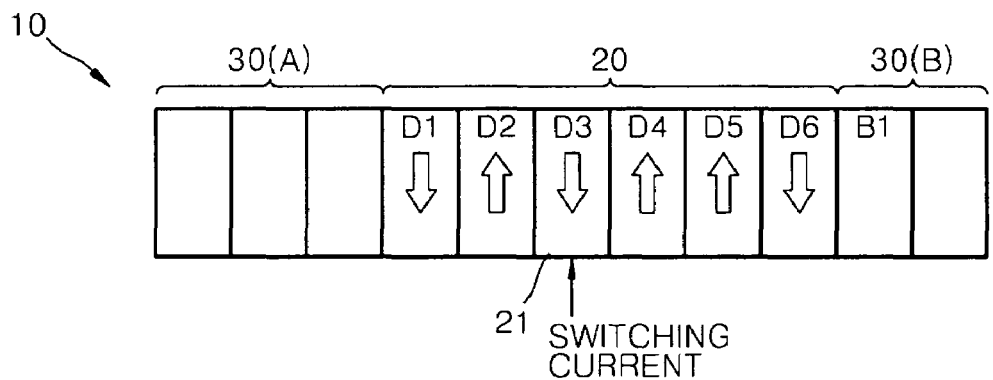
FIGS. 3A through 3C are views illustrating how a magnetization direction of a third data bit region (a data bit region) of FIGS. 1 and 2 may be reversed by applying a switching current and then how a reversed magnetization direction of the third data bit region may be dragged to an adjacent fourth data bit region by a dragging current.
Figure 3B:
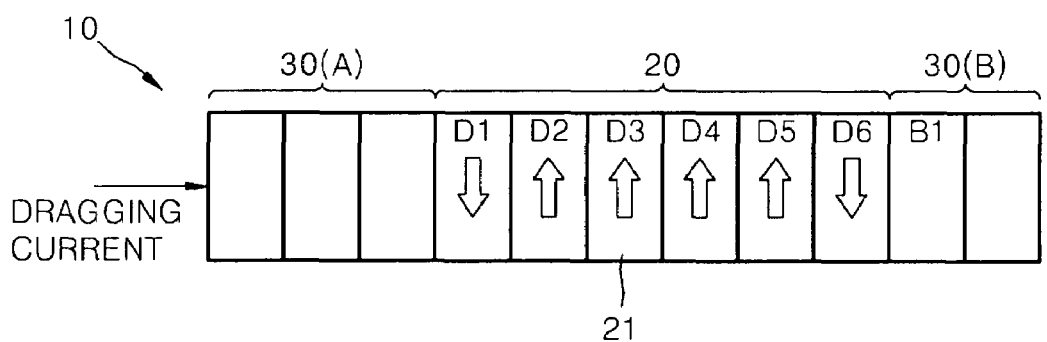
Figure 3C:
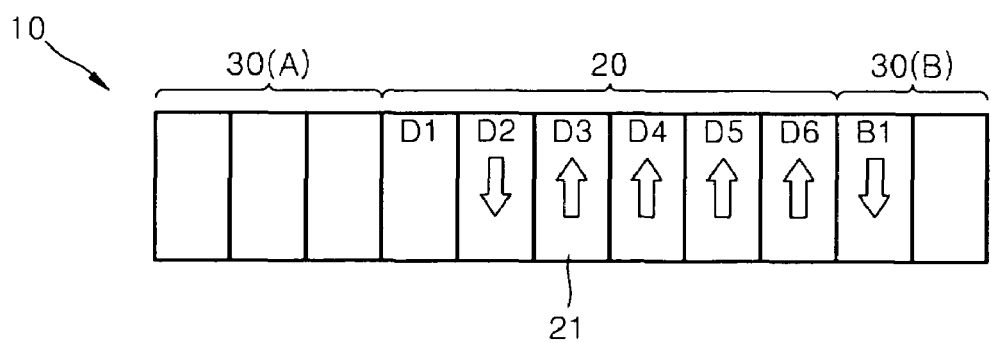
Figure 4A:
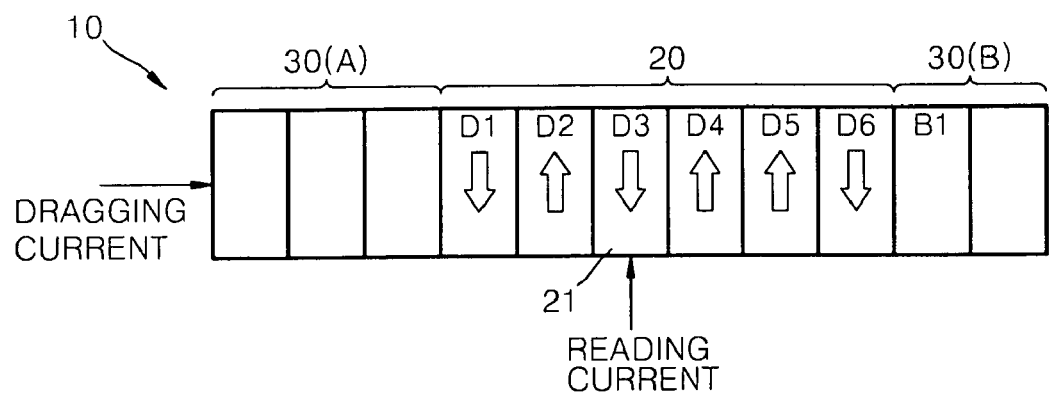
FIGS. 4A and 4B are views illustrating how a magnetization direction of a third data bit region (a data bit region) may be read by applying a reading pulse current to the third data bit region and how it may be dragged to an adjacent fourth data bit region by a dragging current.
Figure 4B:
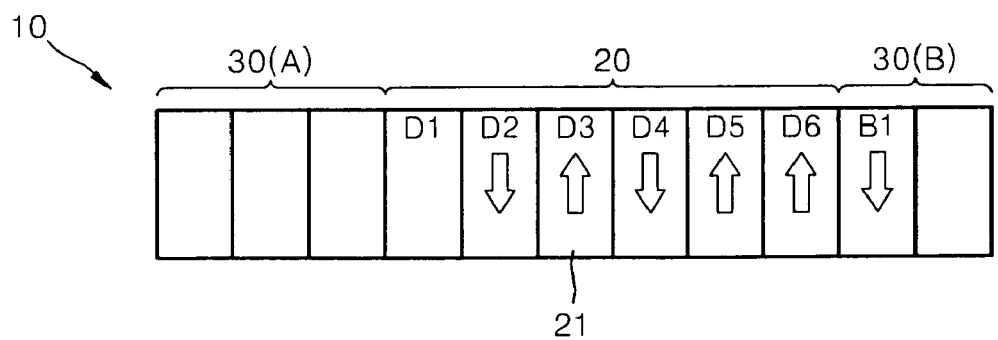

FIGS. 3A through 3C are views showing that a magnetization direction of the third data bit region D3 (the data bit region 21) of FIGS. 1 and 2 may be reversed by applying a switching current. A reversed magnetization direction of the third data bit region D3 may be dragged to the adjacent fourth data bit region D4 by a dragging current. FIGS. 4A and 4B are views showing that a magnetization direction of the third data bit region D3 may be read by applying a reading pulse current to the third data bit region and may be dragged to the adjacent fourth data bit region D4 by a dragging current. FIG. 5 is a graph of a dragging current signal, for example Pulse 1 (Dragging), a reading pulse current signal, for example Pulse 2 (reading), and a switching writing pulse current signal, which may be applied to a magnetic device 10. The horizontal axis of FIG. 5 may be in time (t) units.

An example embodiment data storing operation may be performed as follows. If a switching current is applied to the third data bit region D3 in FIG. 3A, the magnetization direction of the third data bit region D3 may be reversed as shown in FIG. 3B. If a dragging current is applied to the free layer 11, the magnetization direction of each data bit region may be dragged toward an adjacent data bit region as illustrated in FIG. 3C. The magnetization direction of the first through sixth data bit regions D1 to D6 in the data storage cell 20 of FIG. 3B may be dragged toward the second through sixth data bit regions D2 to D6 and toward a first data bit region B1 of the second portion B of the buffer cell 30 by one data bit region.

The magnetization direction of the data bit region 21 may be designated, and then the data and corresponding magnetization direction of the data bit region 21 may be dragged toward the data bit region, for example the fourth data bit region D4, after a desired time. Next, a writing signal may be applied again to the data bit region 21 to designate the magnetization direction. By periodically applying the dragging current and the switching current for writing in synchronization with the dragging current, a magnetization direction designation and dragging operation may be performed alternately. A plurality of data bits may be stored in an array of a plurality of data regions in the free layer 11. After completing data storing, an original data storing position may be maintained, or the data may be stored in the first through sixth data bit regions D1 to D6 of the data storage cell 20 by applying a dragging signal that drags the magnetic domain in an opposite direction.

An example embodiment reading operation may be performed as follows. As shown in FIG. 4A, if a reading pulse current is applied to the third data bit region D3, data of the third data bit region D3 may be read. A dragging current may be applied to the free layer 11 as shown in FIG. 4B, and then the magnetization direction of each data bit region may be dragged into an adjacent data bit region. The magnetization direction of the first through sixth data bit regions D1 to D6 in the data storage cell 20 of FIG. 4A may be dragged toward the second through sixth data bit regions D2 to D6 and toward the first data bit region B1 of the second portion B of the buffer cell 30 by one data bit region.

The magnetization direction of the data bit region 21 may be read, and then the data and the magnetization direction of the data bit region 21 may be dragged toward the data bit region after a desired time. A reading signal may be applied again to the data bit region 21 to read the magnetization direction of the data bit region 21. By periodically applying the dragging current and the pulse current for reading in synchronization with the dragging current, the data reading and dragging operations may be performed alternately until the completion of the reading of a plurality of bits of data stored in the free layer 11. After the completion of the data reading, an original data storing position may be maintained, or the data may be stored in the first through sixth data bit regions D1 to D6 of the data storage cell 20 by applying a dragging signal that drags the magnetic domain in an opposite direction.

During the data reading operation, the pulse current for reading may be synchronized with the domain dragging signal without reversing polarity as shown in FIG. 5, and then may be periodically applied. If the pulse current for reading is applied between the reference layer 15 and the data bit region of the free layer 11, for example, a current passing a tunnel barrier may be changed depending on whether the magnetization directions of the reference layer 15 and the data bit region of the free layer 11 are parallel or anti-parallel. A resistance value for an identical magnetization direction is smaller than a resistance value for an opposite magnetization direction. According to the above resistance difference, a data value stored in the data bit region may be recognized.

A magnetic device, for example a MTJ or GMR, for reading data and a magnetic device for writing using a spin transfer torque method may be present together in a single device Or may be alternately arranged The magnetic device 10 may be used as a magnetic device, for example as a MTJ or GMR, for reading a plurality of bits of data through magnetic domain dragging or as a magnetic device for writing using a spin transfer torque a plurality of bits of data through magnetic domain dragging.

Figure 6:
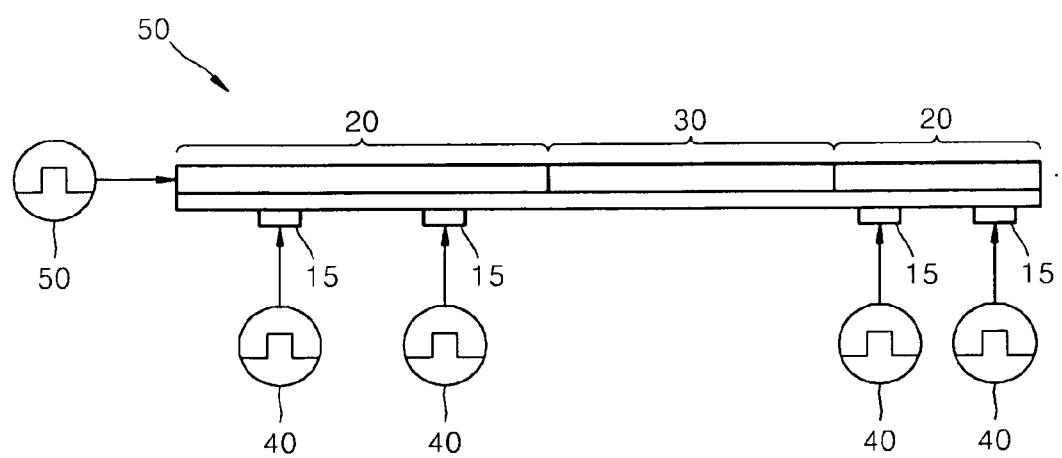
FIG. 6 is view of an example embodiment magnetic device.

FIG. 6 is a view of a magnetic device 50 according to an example embodiment. The magnetic device 50 may include a plurality of data storage cells 20. The magnetic device 50 may further include a buffer cell 30 adjoining the storage cells 20 to store data, which may be dragged outside of the data storage cells 20 during magnetic domain dragging. At least one first input portion 40 may correspond to each of the data storage cells 20. If there are a plurality of data storage cells 20 and at least one first input portion 40 corresponding to each of the data storage cells 20, the data storage capacity may increase the number of the data storage cells 20 increases, and a data storing or data reading speed may be achieved, which is the same as or faster than that of other example embodiments.

In FIG. 6 the buffer cell 30 may be disposed between two data storage cells 20. In a plurality of data storage cells 20, the buffer cell 30 may be placed at least before a first data storing cell and after a last data storing cell and/or between two adjacent data storage cells.

As shown in FIG. 6, one data storage cell 20 may include two reference layers 15 and two first input portions 40. If the one data storage cell 20 includes a plurality of the first input portions 40, a data storing speed or a data reading speed may be improved.

In an example embodiment, if one data storage cell 20 includes a plurality of the reference layers 15 and the first input portions 40, a writing signal and a reading signal may be applied through respectively different first input portions 40 in the magnetic device 50. A data storage cell 20 to which a writing signal may be applied may be separated from a data storage cell 20 that reads the stored data.

The example embodiment magnetic device may include a data storage cell that includes a free layer and a reference layer and may store a plurality of bits of data. The free layer may have a switchable magnetization direction and a plurality of adjoining magnetic domains. The reference layer may be formed to correspond to a partial region of the free layer and may have a pinned magnetization direction. The data storage cell may form a plurality of data bit regions in an array in the free layer. The data storage cell may store a plurality of bits of data in the array based on the effective size unit of the reference layer. A data storing operation or a data reading operation may be performed alternately to a magnetic domain dragging operation. The magnetic domain dragging operation may drag data in data bit region of the free layer toward an adjacent data bit region. A plurality of bits of data may be stored or read In example embodiments.

Because a plurality of bits of data may be stored in each cell of the example embodiment magnetic device, data storage capacity of the magnetic device may be increased. A magnetic device (e.g., MRAM) having a significantly increased data storage capacity may be created from an example embodiment.

While example embodiments have been particularly shown and described with reference to example embodiments thereof, it will be understood by those of ordinary skill in the art that various changes in form and details may be made therein without departing from the spirit and scope of the following claims.

What is claimed is:

1. A magnetic device comprising:
a free layer having a switchable magnetization direction, a plurality of adjoining magnetic domains, and a plurality of data bit regions;
a reference layer corresponding to a portion of the free layer and having a pinned magnetization direction;
a first input portion electrically connected to at least one of the plurality of data bit regions of the free layer and to the reference layer, the first input portion being configured to apply at least one of a writing signal and a reading signal; and
a second input portion electrically connected to the free layer, the second input portion being configured to drag data stored in the plurality of data bit regions of the free layer toward an adjacent data bit region by applying a dragging signal.

2. The magnetic device of claim 1, wherein the free layer and reference layer constitute a data storage cell.

3. The magnetic device of claim 2, wherein the plurality of the data bit regions are arrayed in an effective size of the reference layer and configured to allow the data storage cell to store a plurality of bits of data in the array.

4. The magnetic device of claim 1, wherein the writing signal is a switching current in a pulse form.

5. The magnetic device of claim 4, wherein the reading signal is a pulse current of lesser magnitude than the switching current.

6. The magnetic device of claim 4, wherein one of the switching current and the pulse current for reading are applied alternately with the dragging signal, so a magnetic domain dragging operation follows each data storing operation and a data reading operation in a sequence of operations.

7. The magnetic device of claim 3, wherein each of the plurality of data bit regions includes at least one magnetic domain and wherein each of the plurality of data bit regions performs magnetic domain dragging.

8. The magnetic device of claim 1, wherein each of the plurality of data bit regions includes at least one magnetic domain, and wherein each of the plurality of data bit regions performs magnetic domain dragging, and wherein a magnetic domain dragging operation follows each data storing operation and a data reading operation in a sequence of operations.

9. The magnetic device of claim 1, further comprising:

a non-magnetic layer between the reference layer and the free layer.

10. The magnetic device of claim 9, wherein the non-magnetic layer includes a conductive material.

11. The magnetic device of claim 9, wherein the non-magnetic layer includes an insulating material and acts as a tunneling barrier.

12. The magnetic device of claim 2, further comprising:

a buffer cell that is formed on at least one side of the data storage cell and is configured to store data dragged outside of the data storage cell during magnetic domain dragging.

13. The magnetic device of claim 2, wherein a plurality of data storage cells form an array and at least one first input portion is formed per data storage cell.

14. The magnetic device of claim 12, wherein the buffer cell is located between two adjacent data storage cells.

15. A method of operating a magnetic device comprising:

storing data by a magnetization direction designation of a plurality of data bit regions;

reading the stored data according to a magnetization direction of at least one of the plurality of data bit regions; and performing magnetic domain dragging, wherein one of the data storing and the stored data reading are performed alternately to the magnetic domain dragging.

16. The method of claim 15, wherein the writing signal is a switching current in a pulse form.

17. The method of claim 15, wherein the reading signal is a pulse current has a lesser magnitude than the switching current.

18. The method of claim 15, wherein a magnetic domain dragging operation follows each data storing operation and a data reading operation in a sequence of operations.

19. The method of claim 15, wherein the magnetic domain dragging is performed by a data bit region unit.

20. The method of claim 15, wherein a buffer cell stores data dragged outside of a data storage cell during the magnetic domain dragging.

21. The method of claim 15, wherein data reading and storing is performed in a plurality of data cells.

22. The method of claim 21, wherein the data storing operation is performed in the plurality of data cells.

* * * * *